(12) United States Patent
Weyers et al.

(10) Patent No.: US 11,876,133 B2
(45) Date of Patent: Jan. 16, 2024

(54) SILICON CARBIDE DEVICE WITH TRANSISTOR CELL AND CLAMP REGION

(71) Applicant: Infineon Technologies AG, Neubiberg (DE)

(72) Inventors: Joachim Weyers, Hoehenkirchen (DE); Franz Hirler, Isen (DE); Wolfgang Jantscher, Villach (AT); David Kammerlander, Villach (AT); Ralf Siemieniec, Villach (AT)

(73) Assignee: Infineon Technologies AG, Neubiberg (DE)

( * ) Notice: Subject to any disclaimer, the term of this patent is extended or adjusted under 35 U.S.C. 154(b) by 287 days.

(21) Appl. No.: 17/489,202

(22) Filed: Sep. 29, 2021

(65) Prior Publication Data

US 2022/0102549 A1   Mar. 31, 2022

(30) Foreign Application Priority Data

Sep. 30, 2020   (EP) ..................................... 20199320

(51) Int. Cl.
*H01L 29/78*   (2006.01)
*H01L 29/16*   (2006.01)

(52) U.S. Cl.
CPC ...... *H01L 29/7813* (2013.01); *H01L 29/1608* (2013.01)

(58) Field of Classification Search
CPC ............. H01L 29/7813; H01L 29/1608; H01L 27/0255

USPC .......................................................... 257/77
See application file for complete search history.

(56) References Cited

U.S. PATENT DOCUMENTS

| 2012/0049270 A1* | 3/2012 | Hirler | .................. H01L 29/7808 438/237 |
| 2020/0161466 A1 | 5/2020 | Yen et al. | |
| 2021/0273088 A1* | 9/2021 | Basler | .................. H01L 21/8213 |

FOREIGN PATENT DOCUMENTS

| CN | 110504266 A | * 11/2019 | ........... H01L 21/761 |
| JP | 58178566 A | * 10/1983 | ......... H01L 27/0255 |
| JP | S58178566 A | 10/1983 | |
| JP | S61296770 A | 12/1986 | |
| JP | S648674 A | 1/1989 | |

* cited by examiner

*Primary Examiner* — Igwe U Anya
(74) *Attorney, Agent, or Firm* — Murphy, Bilak & Homiller, PLLC

(57) ABSTRACT

A silicon carbide device includes a transistor cell with a source region and a gate electrode. The source region is formed in a silicon carbide body and has a first conductivity type. A first low-resistive ohmic path electrically connects the source region and a doped region of a second conductivity type. The doped region and a floating well of the first conductivity type form a pn junction. A first clamp region having the second conductivity type extends into the floating well. A second low-resistive ohmic path electrically connects the first clamp region and the gate electrode.

14 Claims, 11 Drawing Sheets

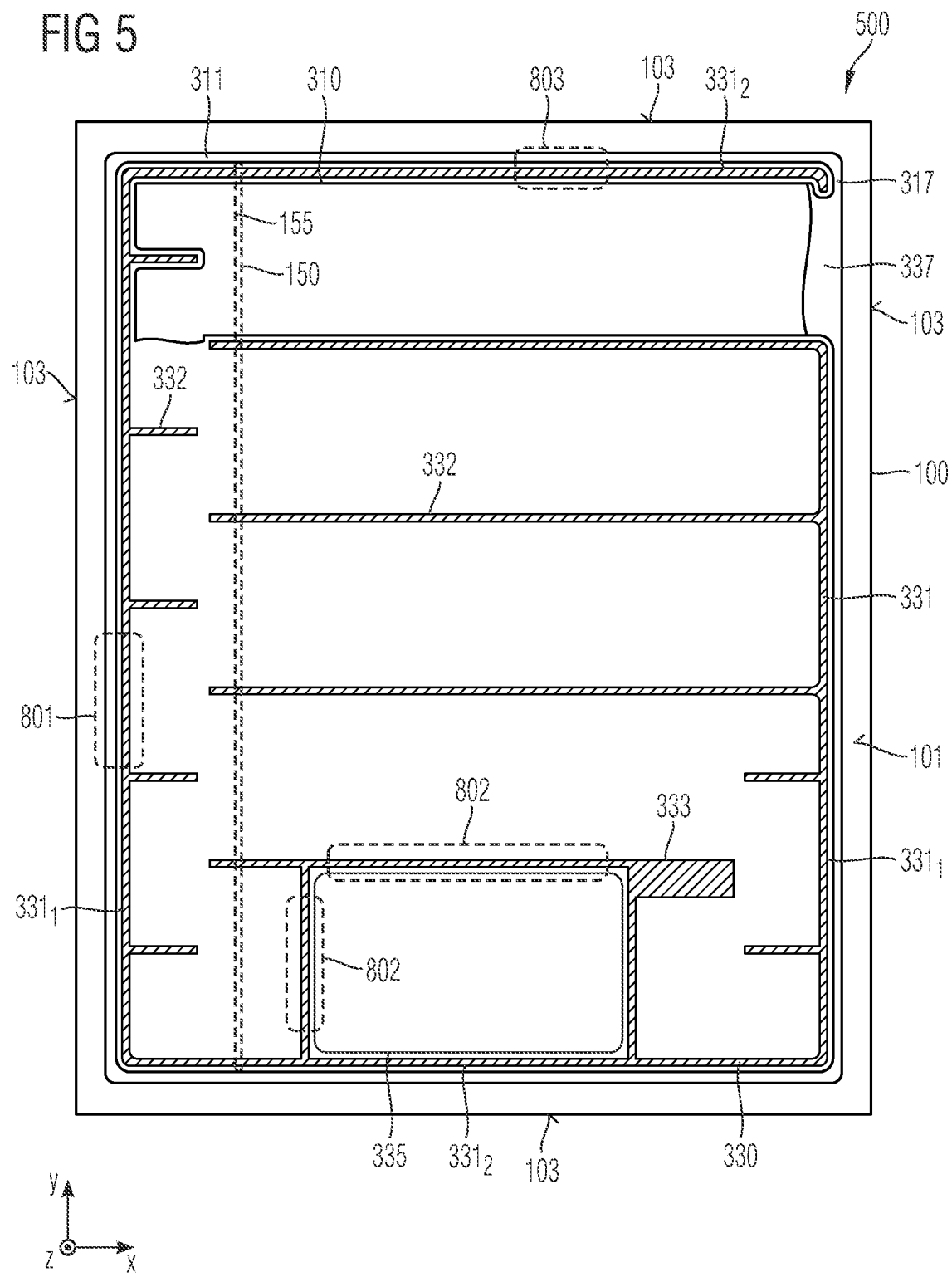

US 11,876,133 B2

SILICON CARBIDE DEVICE WITH TRANSISTOR CELL AND CLAMP REGION

TECHNICAL FIELD

Examples of the present disclosure relate to a silicon carbide device with transistor cells, in particular to a semiconductor device with an insulated gate transistor cell and a clamp between a gate electrode and a source electrode of the transistor cell.

BACKGROUND

Power semiconductor devices are typically used as switches and rectifiers in electric circuits for transforming electrical energy, for example, in DC/AC converters, AC/AC converters or AC/DC converters, and in electric circuits that drive heavy inductive loads, e.g. in motor driver circuits. Since the dielectric breakdown field strength of silicon carbide (SiC) is high compared to silicon (Si), SiC power devices may be significantly thinner and may show lower on-state resistance than their silicon counterparts. Integrated protection elements and/or protection circuits increase device reliability at the cost of additional process complexity.

There is a need to increase reliability of silicon carbide devices with little effort.

SUMMARY

An embodiment of the present disclosure relates to a silicon carbide device. The silicon carbide device includes a transistor cell with a gate electrode and a source region. The source region is formed in a silicon carbide body and has a first conductivity type. A first low-resistive ohmic path electrically connects the source region and a doped region of the second conductivity type. A floating well and the doped region form a pn junction. A first clamp region having the second conductivity type extends into the floating well. A second low-resistive ohmic path electrically connects the first clamp region and the gate electrode.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a silicon carbide device and together with the description serve to explain principles of the embodiments. Further embodiments are described in the following detailed description and the claims.

FIG. 5 shows a schematic plan view of a silicon carbide device indicating possible areas for a bidirectional clamp according to embodiments.

DETAILED DESCRIPTION

Figure 1A:
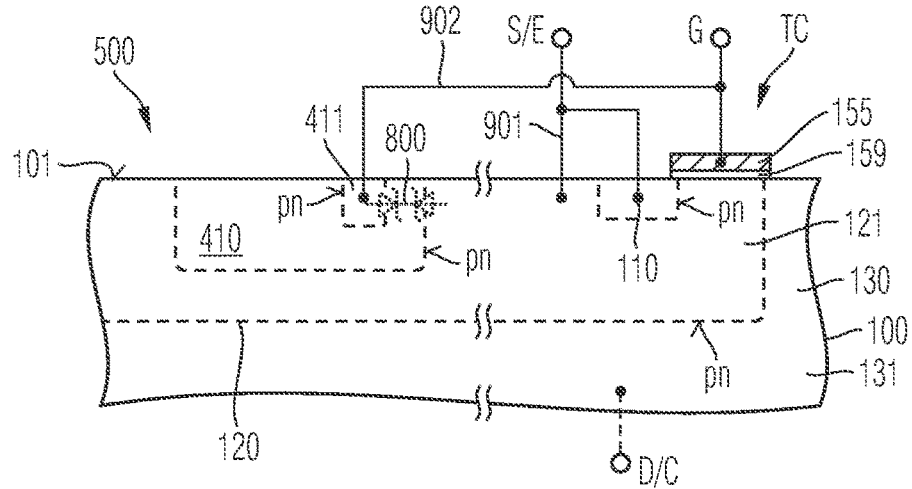
FIGS. 1A-1B show schematic vertical cross-sectional views of portions of silicon carbide devices with clamp regions of bidirectional clamps according to embodiments.

In the following detailed description, reference is made to the accompanying drawings, which form a part hereof and in which are shown by way of illustrations specific embodiments in which a silicon carbide device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive ohmic connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An "ohmic contact" is a non-rectifying electrical junction with a linear or almost linear current-voltage characteristic.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa.

Ranges given for physical dimensions include the boundary values. For example, a range for a parameter y from a to b reads as a≤y≤b. The same holds for ranges with one boundary value like "at most" and "at least".

The term "on" is not to be construed as meaning "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

The terms "power semiconductor device" and "SiC power device" refer to semiconductor devices with a high voltage blocking capability of at least 30 V, for example 100 V, 600 V, 1.6 kV, 3.3 kV or more and with a nominal on-state current or forward current of at least 1 A, for example 10 A or more.

An ohmic contact describes a non-rectifying electrical junction between two conductors. The ohmic contact has a linear or approximately linear current-voltage (I-V) curve in the first and third quadrant of the I-V diagram as with Ohm's law.

A silicon carbide device may include a transistor cell with a source region. The source region may be formed in a silicon carbide body and has a first conductivity type.

The silicon carbide body may have two essentially parallel main surfaces, which may have approximately the same shape and size, and a lateral surface connecting the edges of the two main surfaces. For example, the silicon carbide body may be a cylinder or a polygonal, e.g. rectangular or hexagonal, prism with or without rounded edges. The silicon carbide body may have a surface extension along two horizontal directions and may have a thickness along a vertical direction perpendicular to the horizontal directions. The horizontal directions are also referred to as lateral directions in the following.

The material of the silicon carbide body may be single-crystalline silicon carbide, for example 15R—SiC (silicon carbide of 15R-polytype), or silicon carbide with hexagonal polytype like 2H—SiC, 4H—SiC or 6H—SiC, by way of example. In addition to the main constituents silicon and carbon, the silicon carbide body may include dopant atoms, for example nitrogen (N), phosphorous (P), beryllium (Be), boron (B), aluminum (Al) and/or gallium (Ga). The silicon carbide body may include further impurities, for example hydrogen, fluorine and/or oxygen.

The transistor cell may be or may include an insulated gate transistor cell with an insulated gate electrode. The gate electrode may be a planar gate electrode formed on a main surface of the silicon carbide body or may be a trench gate electrode formed in a trench extending from a main surface into the silicon carbide body.

The transistor cell may include a body region, and the silicon carbide body may further include a drain/drift region. At least a portion of the drain/drift region may have the first conductivity type and may be effective as the drain of the transistor cell.

The body region may have a complementary second conductivity type. The body region may spatially separate the source region and the portion of the drain/drift region with the first conductivity type. A gate dielectric may be formed between the gate electrode and the body region. An electric potential applied to the gate electrode controls the distribution of mobile charge carriers in the body region by field effect.

The silicon carbide device may further include a doped region formed in the silicon carbide body. The doped region has the second conductivity type. The doped region may be or may include a horizontally contiguous structure including portions of different vertical extension and/or with different vertical dopant profiles.

The doped region may be a one-part structure or may be a multi-part structure. For example, the doped region may include two or more individual portions, which are laterally and/or vertically separated within the silicon carbide body. The individual portions of a multi-part doped region may be electrically connected through low-resistive ohmic paths.

A first low-resistive ohmic path may electrically connect the doped region and the source region. The ohmic resistance of the first low-resistive ohmic path may be at most 2Ω, e.g. at most 1Ω, or at most 0.5Ω.

The silicon carbide device may further include a floating well formed in the silicon carbide body. The floating well has the first conductivity type. The floating well and the doped region form a pn junction. The floating well may be without any further ohmic connection or with only a high-ohmic connection to another conductive structure of the silicon carbide device. For example, an equalizing current in a range of some nA may at least temporarily flow between the floating well and the source region. A maximum equalizing current between the floating well and the source region may be greater than 0.1 nA, e.g. greater than 0.5 nA or greater than 1 nA. The maximum equalizing current may be less than 100 nA, less than 10 nA or less than 5 nA.

A first clamp region may extend into the floating well. The first clamp region may have the second conductivity type. For example, the first clamp region may have the second conductivity type, and the floating well and the first clamp region may form a pn junction. The floating well may laterally surround the first clamp region within the silicon carbide body.

A second low-resistive ohmic path may electrically connect the first clamp region and the gate electrode. The ohmic resistance of the second low-resistive ohmic path may be at most 2Ω, e.g. at most 1Ω, or at most 0.5Ω.

The doped region, the floating well and the first clamp region form a bidirectional clamp effective, e.g., between a gate metallization and a first load metallization, wherein an avalanche breakdown of one of the pn junctions between the doped region and the first clamp regions defines the clamp breakdown voltage. The bidirectional clamp may protect the transistor cell against overvoltage events. In particular the bidirectional clamp may protect the gate dielectric, which in silicon carbide power devices can be to a high degree susceptible for overvoltage events, e.g. electrostatic discharge (ESD).

Due to the high intrinsic breakdown voltage of silicon carbide, the bidirectional clamp formed in the silicon carbide body may short-circuit and dissipate overvoltage events, e.g. ESD events, without being damaged. Due to the large band gap and the low intrinsic thermal carrier generation of silicon carbide, the leakage through the bidirectional clamp is low compared to equivalent circuits in single crystalline silicon or in polycrystalline silicon.

The floating well allows the characteristics of the bidirectional clamp to be efficiently decoupled from a blocking voltage applied between the first load metallization and the drain/drift region.

According to an embodiment the silicon carbide device may include a gate metallization. The gate metallization may be formed on a first main surface at the front side of the silicon carbide body. The gate metallization may include a gate pad from a metallic material and/or one or more gate conductors from a metallic material. The metallic material may include one or more elemental metals, e.g. copper (Cu), aluminum (Al), titanium (Ti) or tantalum (Ta), one or more metal alloys, e.g. copper aluminum (CuAl), and/or one or more metal compounds, e.g. a metal silicide or a metal nitride.

The gate metallization and the gate electrode may be electrically connected to each other. For example, the gate pad and/or a gate conductor may be formed directly on a portion of the gate electrode, wherein the gate electrode and the gate pad and/or the gate electrode and the gate conductor form a low-resistive ohmic contact. Alternatively, the gate metallization may include a metallic gate contact structure extending from the gate pad and/or the gate conductor to the gate electrode, wherein the gate contact structure and the gate electrode form a low-resistive ohmic contact In addition, the gate metallization and the first clamp region may form an ohmic contact, e.g. a low-resistive ohmic contact. The gate pad and/or a gate conductor may be formed directly on a portion of the first clamp region, wherein the first clamp region and the gate pad and/or the first clamp region and the gate conductor form a low-resistive ohmic contact. Alternatively, the gate metallization may include a metallic clamp contact structure extending from the gate pad and/or the gate conductor to the first clamp region, wherein the clamp contact structure and the first clamp region form a low-resistive ohmic contact.

By forming the first clamp region directly below a portion of the gate metallization, the bidirectional clamp may be integrated in a space-saving and area-efficient way.

According to an embodiment the silicon carbide device may include a first load metallization. The first load metallization may be formed on the first main surface at the front side of the silicon carbide body. The first load metallization may include a load pad from a metallic material and/or one or more edge conductors from a metallic material. The metallic material may include one or more elemental metals, e.g. copper (Cu), aluminum (Al), titanium (Ti) or tantalum (Ta), one or more metal alloys, e.g. copper aluminum (CuAl), and/or one or more metal compounds, e.g. a silicide or a nitride.

The first load metallization and the source region may be electrically connected to each other. For example, the load pad may be formed directly on a portion of the source region, wherein the source region and the load pad form a low-resistive ohmic contact. Alternatively, the first load metallization may include a metallic load contact structure extending from the load pad to the source region, wherein the load contact structure and the source region form a low-resistive ohmic contact.

In addition, the first load metallization and the doped region may form an ohmic contact, e.g. a low-resistive ohmic contact. The load pad and/or the edge conductor may be formed directly on a portion of the doped region, wherein the doped region and the load pad and/or the doped region and the edge conductor form a low-resistive ohmic contact.

According to other embodiments, the first load metallization includes one or more further metallic load contact structures.

For example, the source region and the doped region may be formed side-by-side and a single metallic load contact structure extends from the load pad to the source region and to the doped region and forms low-resistive ohmic contacts with both the source region and the doped region.

According to another example, the source region and the doped region may be formed at a lateral distance to each other. The first load metallization may include a metallic first and a metallic second load contact structure. The first load contact structure and the source region may form a low-resistive ohmic contact. The second load contact structure and the doped region may form another ohmic contact, e.g. a low-resistive ohmic contact. Alternatively or in addition, the first load metallization may include an edge contact structure extending from the edge conductor through the interlayer dielectric to the doped region, wherein the doped region and the edge conductor structure form a low-resistive ohmic contact.

By using a portion of the doped region as part of the bidirectional clamp, the latter may be integrated in a space saving and area-efficient way.

According to an embodiment the doped region may include a second clamp region within the floating well, wherein the second clamp region and the first load metallization may be electrically connected.

The first load metallization and the second clamp region may form an ohmic contact, e.g. a low-resistive ohmic contact. For example, the load pad and/or the edge conductor may be formed directly on the second clamp region, wherein the second clamp region and the load pad and/or the second clamp region and the edge conductor form an ohmic contact, e.g. a low-resistive ohmic contact. Alternatively, the first load metallization may include a metallic load contact structure extending from the load pad to the second clamp region, wherein the load contact structure and the second clamp region form a low-resistive ohmic contact. Alternatively, the first load metallization may include a metallic edge contact structure extending from the edge conductor to the second clamp region, wherein the edge contact structure and the second clamp region form a low-resistive ohmic contact.

The second clamp region forms an individual portion of the doped region. In addition to the second clamp region, the doped region may include one or more further portions outside the floating well. The first load metallization may include further load contact structures, wherein the further load contact structures and the further portions of the doped regions may form low-resistive ohmic contacts.

With the first and second clamp regions formed within the same floating well, it may be possible to decouple the performance of the bidirectional clamp to a high degree from the characteristics and the operation mode of the transistor cell. The breakdown characteristic may be to a high degree symmetric with regard to the polarity of the voltage.

According to an embodiment the floating well, the first clamp region, and the second clamp region may extend from the first main surface of the silicon carbide body into the silicon carbide body, wherein the bidirectional clamp may be formed in a cost-saving manner and by using implantation masks formed on the same main surface. In addition, the number of oppositely doped layers may be kept small and it is possible to avoid side effects induced by parasitic bipolar transistor and/or thyristor structures to a high degree.

According to an embodiment the floating well may include a main portion and an enhanced portion. A mean net dopant concentration in the enhanced portion may be higher than in the main portion and lower than in the source region. The enhanced portion may extend from the first main surface into the floating well or may be formed at a distance to the first main surface.

A first part of the enhanced portion may be formed between the first clamp region and the second clamp region. The enhanced portion may exclusively include the first part or may include further parts. The first part may be formed along only a section of a line connecting the first clamp region and the second clamp region.

With the enhanced portion it may be possible to fine-tune the breakdown characteristic of the bidirectional clamp and to fix the position of the breakdown path along the first main surface.

According to an embodiment the first part of the enhanced portion may extend from the first clamp region to the second clamp region.

In this way it is possible to locate the breakdown of the bidirectional clamp between the first clamp region and the second clamp region and within the floating well such that functional elements outside the floating well are hardly affected by breakdowns of the bidirectional clamp.

According to an embodiment the enhanced portion may laterally surround the first clamp region and the second clamp region. For example, a second part of the enhanced portion between the first clamp region and the lateral sidewall of the floating well and between the second clamp region and the lateral sidewall of the floating well may decrease the influence of neighboring structures on the characteristics of the bidirectional clamp.

According to an embodiment the enhanced portion, in particular the second part of the enhanced portion, may be laterally separated from a lateral sidewall of the floating well.

According to an embodiment the bidirectional clamp including the first clamp region and the floating well may be configured to carry a breakdown current of at least 0.5 A and for example at most 10 A, wherein the breakdown current flows between the first clamp region and the doped region through the floating well. The breakdown current may be in a range from 0.5 A to 2 A. Suitably configured first clamp regions and floating wells facilitate dissipating standard ESD pulses according to the human body model without persistent damage of the silicon carbide body and the transistor cells.

According to an embodiment the second low-resistive ohmic path may include a metallic gate conductor. The gate conductor may include stripe-shaped portions and may cross the gate electrode. For example, a longitudinal extension of a portion of the gate conductor may run perpendicular to a longitudinal extension of the gate electrode.

A low-resistive ohmic contact may be formed between the gate conductor and the gate electrode. The gate conductor may be in direct contact with the gate electrode, wherein the gate conductor and the gate electrode form the low-resistive ohmic contact. Alternatively, a metallic gate contact structure may extend from the gate conductor to the gate electrode, wherein the gate contact structure and the gate electrode form the low-resistive ohmic contact.

Another low-resistive ohmic contact may be formed between the gate conductor and the first clamp region. The gate conductor may be in direct contact with the first clamp region, wherein the gate conductor and the first clamp region form the low-resistive ohmic contact. Alternatively, a metallic clamp contact structure may extend from the gate conductor to the first clamp region, wherein the gate contact structure and the first clamp region form the low-resistive ohmic contact.

By using the silicon carbide portion below the gate conductor, the bidirectional clamp can be formed without or with only low loss of active chip area.

According to an embodiment the first low-resistive ohmic path may include an edge conductor. The edge conductor may be stripe-shaped and may be formed between the gate conductor and a lateral surface of the silicon carbide body.

A low-resistive ohmic contact may be formed between the edge conductor and a portion of the doped region. For example, the doped region may include a junction termination portion between the gate conductor and the lateral edge of the silicon carbide body and the low-resistive ohmic contact may be formed between the edge conductor and the junction termination portion.

The edge conductor may be in direct contact with the doped region, wherein the edge conductor and the doped region may form the low-resistive ohmic contact. Alternatively, a metallic edge contact structure may extend from the edge conductor to the doped region, wherein the edge contact structure and the doped region form the low-resistive ohmic contact.

According to an embodiment the doped region may include a second clamp region within the floating well, wherein the low-resistive ohmic contact between the edge conductor and the doped region is formed between the edge conductor and the second clamp region.

Completely integrating the bidirectional clamp in a floating well may contribute to reducing the influence of the transistor cells on the characteristics of the bidirectional clamp.

According to an embodiment the first low-resistive ohmic path may include a load pad. The load pad may be configured as bond wire base.

A low-resistive ohmic contact may be formed between the load pad and the source region. The load pad may be in direct contact with the source region, wherein the load pad and the source region form the low-resistive ohmic contact. Alternatively, a metallic load contact structure may extend from the load pad to the source region, wherein the load contact structure and the source region form the low-resistive ohmic contact.

In addition, a low-resistive ohmic contact may be formed between the load pad and the doped region. The load pad may be in direct contact with the doped region, wherein the load pad and the doped region form the low-resistive ohmic contact. Alternatively, a metallic load contact structure may extend from the load pad to the doped region, wherein the load contact structure and the doped region form the low-resistive ohmic contact.

For example, load pad and edge conductor may be formed on opposite sides of a gate conductor. A low-resistive ohmic contact may be formed between the load pad and a portion of the doped region oriented to the transistor cells and another low-resistive ohmic contact may be formed between the junction termination portion of the doped region and the edge conductor.

An effective length of the floating well perpendicular to the gate conductor may be comparatively small. A small effective length may reduce the risk for latch-up during dynamic switching of the transistor cells.

By using the silicon carbide portion below the edge conductor, it is possible to provide the bidirectional clamp without or with only low loss of active chip area.

Figure 1B:
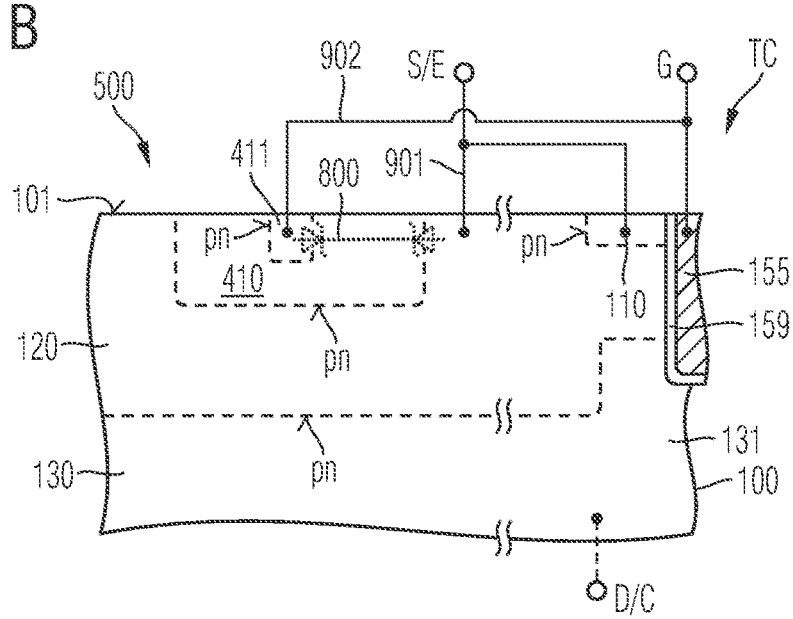
Figure 1C:
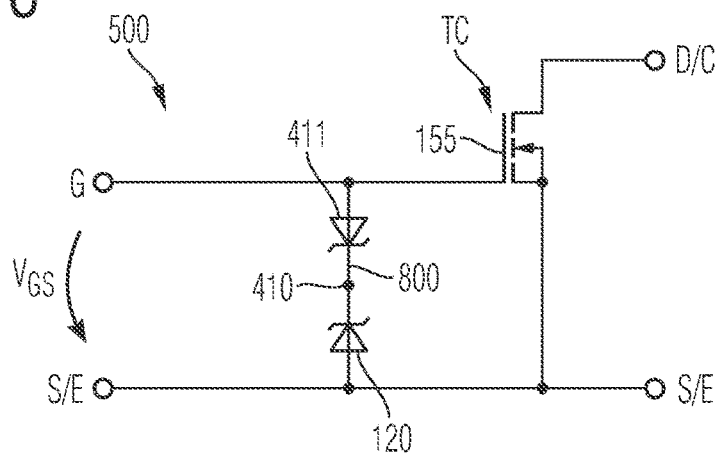
FIG. 1C shows a simplified circuit diagram of the silicon carbide devices of FIGS. 1A-1B.

FIGS. 1A-1C refer to silicon carbide devices 500 with a monolithically integrated bidirectional clamp 800. The silicon carbide devices 500 may be or may include an IGFET (insulated gate field effect transistor), for example an MOSFET (metal oxide semiconductor FET) or an IGBT (insulated gate bipolar transistor) with a plurality of identical transistor cells TC electrically connected in parallel.

The silicon carbide body 100 shown in FIGS. 1A-1B includes or consists of single crystalline silicon carbide, e.g., a silicon carbide crystal including the main constituents silicon and carbon. The silicon carbide crystal may include dopant atoms and further impurities like hydrogen, fluorine and/or oxygen. The polytype of the silicon carbide crystal may be 15R or may be hexagonal, e.g. 2H, 6H, or 4H. The silicon carbide body 100 may include or consist of a silicon carbide layer grown by epitaxy.

A first main surface 101 at a front side of the silicon carbide body 100 may be planar or ribbed. A mean plane of the first main surface 101 extends along horizontal directions. The mean plane of a planar first main surface 101 is identical with the planar first main surface 101. In case of a non-planar first main surface 101, for example in case of a ribbed first main surface 101, the mean plane may be a planar least squares plane. Position and orientation of the planar least squares plane are defined such that the sum of the squares of the deviations of surface points of the ribbed first main surface 101 from the planar least squares plane has a minimum.

A vertical direction is orthogonal to the horizontal directions, e.g. parallel to the surface normal onto the mean plane. The horizontal directions are also referred to as lateral directions in the following.

The vertical direction may coincide with a main lattice direction or may be tilted to a main lattice direction by an off-axis angle, wherein the off-axis angle may be in a range from 2° to 8°, in particular about 4°. Opposite to the front side, a second main surface may extend parallel to the planar first main surface 101 or parallel to the least squares plane of a ribbed first main surface 101.

An insulated gate transistor cell TC is formed at the front side of the silicon carbide body 100. A drain/drift region 130 laterally extends through the silicon carbide body 100 between the insulated gate transistor cells TC and the second main surface. The drain/drift region 130 may include a voltage sustaining structure, e.g., a lightly doped drift zone 131.

The insulated gate transistor cell TC includes a source region 110 and a body region 121. The source region 110 and the body region 121 are doped portions of the silicon carbide body 100. The source region 110 has a first conductivity type. The body region 121 has a second conductivity type. For example, the source region 110 is n conducting and the body region 121 is p conducting.

The body region 121 may form part of a doped region 120 of the second conductivity type. The doped region 120 includes further portions, for example a junction termination portion, a shielding portion, and/or a contact portion, by way of example.

A first low-resistive ohmic path 901 electrically connects the source region 110 and the doped region 120. A first load terminal S/E and the first low-resistive ohmic path 901 are electrically connected. The first load terminal S/E may be the source terminal S of an MOSFET or the emitter terminal of an IGBT. The drain/drift region 130 is electrically connected or coupled to a second load terminal D/C which may be the drain terminal D of an MOSFET or the collector terminal of an IGBT.

A floating well 410 of the first conductivity type extends from the first main surface 101 into the doped region 120. The floating well 410 and the doped region 120 form a pn junction. The doped region 120 surrounds the floating well 410 on all sides within the silicon carbide body 100.

A first clamp region 411 of the second conductivity type extends from the first main surface 101 into the floating well 410. The first clamp region 411 and the floating well 410 form a pn junction. The floating well 410 surrounds the first clamp region 411 on all sides within the silicon carbide body 100.

A gate dielectric 159 separates the body region 121 from a gate electrode 155.

In FIG. 1A the transistor cell TC includes a planar gate electrode 155 formed on the first main surface 101.

In FIG. 1B the transistor cell TC includes a trench gate electrode 155 formed in a trench that extends from the first main surface 101 into the silicon carbide body 100.

A second low-resistive ohmic path 902 electrically connects the gate electrode 155 and the first clamp region 411. In addition, a gate terminal G may be electrically connected to the first clamp region 411 and the gate electrode 155 through a low impedance path.

The silicon carbide device 500 includes a plurality of the insulated gate transistor cells TC electrically connected in parallel and may include a plurality of spatially separated floating wells 410 with first clamp regions 411.

According to FIG. 1C the bidirectional clamp 800 clamps a gate voltage $V_{GS}$ between the gate electrode 155 and the doped region 120. For n-channel transistor cells TC, the positive clamp voltage is defined by the avalanche breakdown voltage of the pn junction between floating well 410 and the doped region 120. The negative clamp voltage is defined by the avalanche breakdown voltage of the pn junction between first clamp region 411 and floating well 410.

Figure 2A:
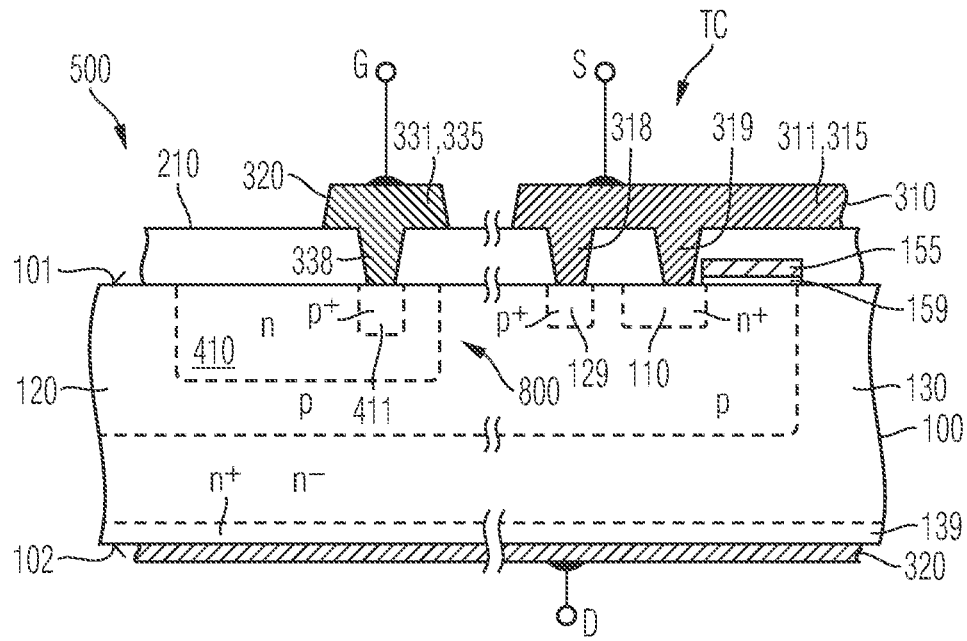
FIGS. 2A-2B show schematic vertical cross-sectional views of portions of silicon carbide devices with clamp regions, gate metallizations, first load metallizations and second load metallizations according to further embodiments.
Figure 2B:
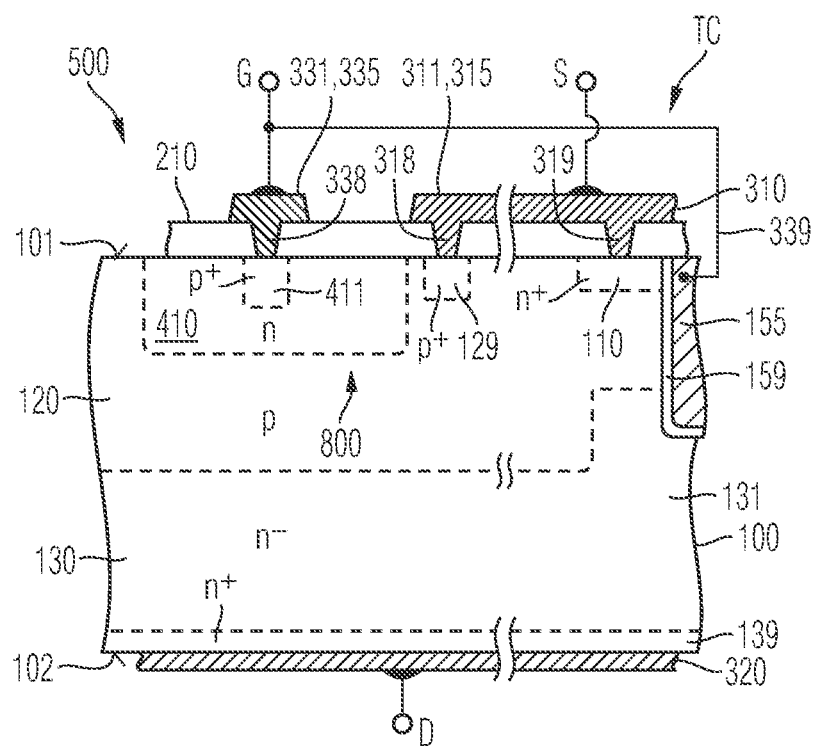

In FIGS. 2A-2B the silicon carbide devices 500 are re-channel MOSFETs with n conductive source regions 110, n⁻ conductive drift zones 131, n conductive floating wells 410 and p conductive doped regions 120 including $p^+$ conductive first clamp regions 411.

An interlayer dielectric 210 is formed on the first main surface 101. A first load metallization 310 and a gate metallization 330 are formed on the front side. The first load metallization 310 includes a load pad 315 and edge conductors 311 formed on the interlayer dielectric 210. The first load metallization 310 further includes load contact structures 319 extending from the load pad 315 through openings in the interlayer dielectric 210 to the source regions 110 and to the doped region 120. In addition, the first load metallization 310 may include edge contact structures 318 extending from the edge conductor 311 through openings in the interlayer dielectric 210 to the doped region 120. Along the interface to the edge contact structure 318, the doped region 120 may include a heavily doped contact region 129, wherein the edge contact structure 318 and the heavily doped contact region 129 form a low-resistive ohmic metal/semiconductor contact.

The gate metallization 330 includes a gate pad 335 and gate conductors 331 formed on the interlayer dielectric 210. The gate metallization 330 further includes gate contact structures 339 extending from the gate pad 335 and/or from the gate conductor 331 through openings in the interlayer dielectric 210 to the gate electrodes 155. The gate metallization 330 may include clamp contact structures 338 extending from the gate pad 335 and/or from the gate conductor 331 through openings in the interlayer dielectric 210 to the first clamp regions 411.

The first load metallization 310 at the front side forms or is electrically connected to a source terminal S. A second load metallization 320 is in contact with the second main surface 102 on the back side and forms or is electrically connected to a drain terminal D. The drain/drift region 130 includes a more heavily doped n$^+$ conductive contact layer 139 along the second main surface 102, wherein the contact layer 139 and the second load metallization 320 form a low-resistive ohmic contact.

Figure 3A:
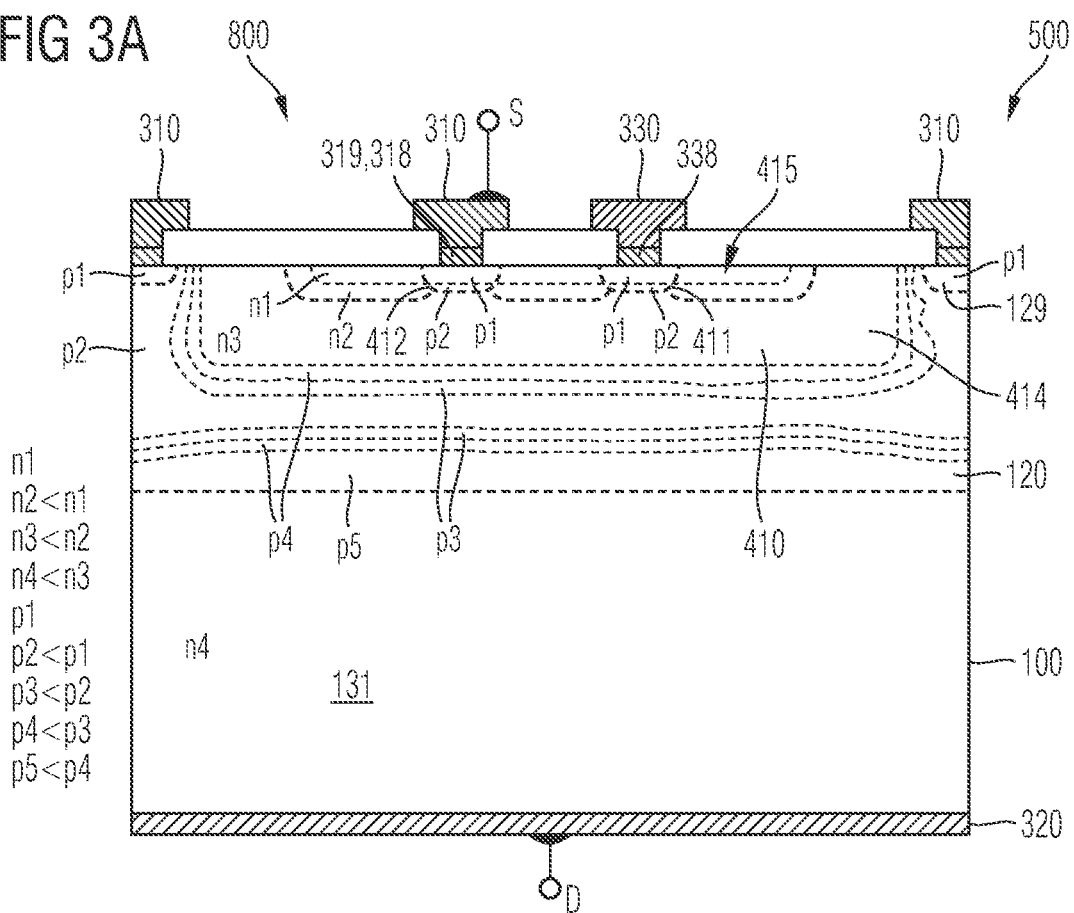
FIG. 3A shows a schematic vertical cross-sectional view of a portion of a silicon carbide device with an integrated symmetric bidirectional clamp according to an embodiment with a first and a second clamp region extending into a floating well.

FIG. 3A shows an example for a symmetric bidirectional clamp 800. An n conductive floating well 410 extends from a first main surface 101 into a p conductive doped region 120. A p conductive first clamp region 411 and a p conductive second clamp region 412 extend from the first main surface 101 into the floating well 410. The first and second clamp regions 411, 412 are laterally separated from each other and are formed symmetric with respect to a central plane orthogonal to the cross-sectional plane.

The floating well 410 includes a main portion 414 and an enhanced portion 415. A mean net dopant concentration in the enhanced portion 415 is higher than in the main portion 414 The enhanced portion 415 extends from the first main surface 101 into the floating well 410. A first part of the enhanced portion 415 is formed between the first clamp region 411 and the second clamp region 412. The first part of the enhanced portion 415 may extend from the first clamp region 411 to the second clamp region 412. A second part of the enhanced portion 415 may surround the first clamp region 411, the second clamp region 412 and the first part of the enhanced portion 415. The second part of the enhanced portion 415 may be spaced from a lateral sidewall of the floating well 410.

In an alternative embodiment, the enhanced portion 415 may form a contiguous layer below the first and second clamp regions 411, 412.

A first load metallization 310 is electrically connected to the doped region 120 through heavily doped contact regions 129, to the second clamp region 412 and to a source terminal S. The heavily doped contact regions 129 may be laterally in direct contact with the floating well 410 or may be laterally spaced from the floating well 410 by a less strongly doped portion of the doped region 120. A gate metallization 330 is electrically connected to the first clamp region 411. A second load metallization 320 at the backside is electrically connected to the drain terminal D.

Figure 3B:
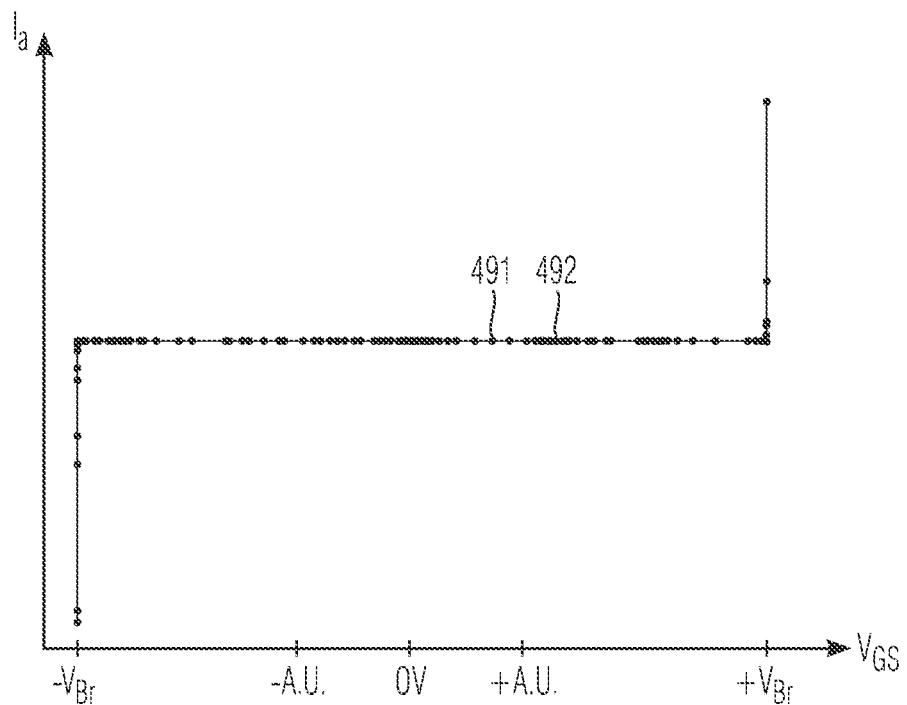
FIG. 3B shows a schematic diagram illustrating breakdown characteristics of the bidirectional clamp of FIG. 3A.

FIG. 3B shows the breakdown characteristics of the bidirectional clamp 800 of FIG. 3A as a plot of the clamp current $I_{CL}$ vs. the gate-to-source voltage $V_{GS}$. A first line 491 shows the breakdown characteristic at a drain-to-source voltage $V_{DS}$ equal to 0V and a second line 492 shows the breakdown characteristic at a drain-to-source voltage $V_{DS}$ equal to 650V. The breakdown characteristic is to a high degree decoupled from the current transistor blocking voltage. In addition, the deviation between the amount of the negative breakdown voltage and the amount of the positive breakdown voltage is less than 20% of the sum of the two amounts.

Figure 3C:
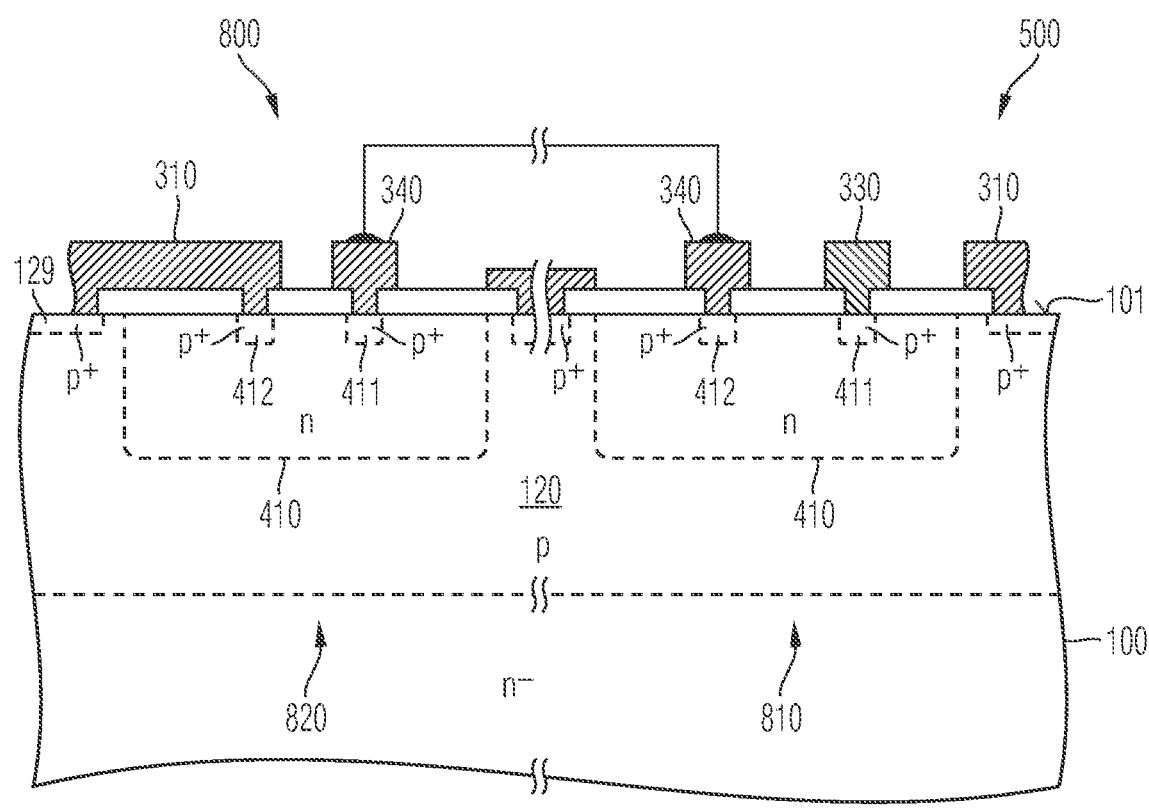
FIG. 3C shows a schematic vertical cross-sectional view of a portion of a silicon carbide device according to an embodiment with a bidirectional clamp including two clamp portions electrically connected in series.

FIG. 3C shows a bidirectional clamp 800 with a first clamp portion 810 and a second clamp portion 820. Each clamp portion 810, 820 includes a floating well 410, a first clamp region 411 extending into the floating well 410 and a second clamp region 412 extending into the floating well 410. A doped region 120 embeds the floating wells 410 of both clamp portions 810, 820. Embedding the first and second clamp regions 411, 412 in a floating well 410 which is embedded in the doped region 120 facilitates series configuration of the first and second clamp portions 810, 820 and provides further room for tuning the electrical characteristics of the bidirectional clamp 800.

For example, the first clamp region 411 of the first clamp portion 810 is electrically connected to a gate metallization 330. The second clamp region 412 of the second clamp portion 820 is electrically connected to a first load metallization 310. The second clamp region 412 of the first clamp portion 810 and the first clamp region 411 of the second clamp portion 820 are electrically connected to each other via an auxiliary conductor 340.

The first and second clamp portions 810, 820 may be formed side-by-side, wherein a vertical portion of the doped region 120 may laterally separate the first and second clamp portions 810, 820. Alternatively, the first and second clamp portions 810, 820 may be formed in different parts of the silicon carbide body 100. The first and second clamp portions 810, 820 may have the same orientation or may be twisted to each other, e.g. by 90 degrees.

Figure 4:
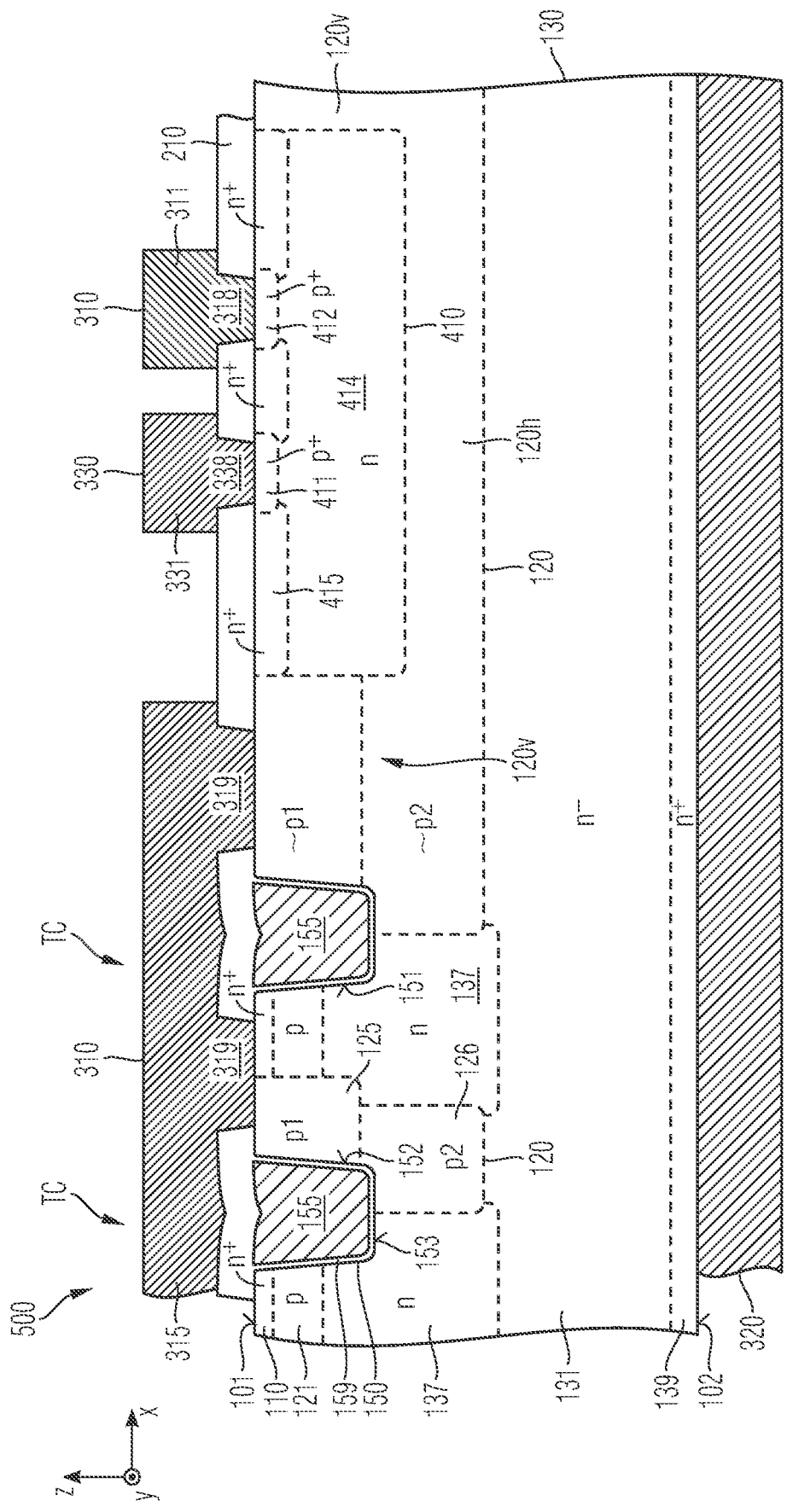
FIG. 4 shows a schematic vertical cross-sectional view of a portion of a silicon carbide device with transistor cells and an integrated bidirectional clamp according to an embodiment.

FIG. 4 shows a silicon carbide device 500 which includes a silicon carbide body 100, a first load metallization 310, a gate metallization 330, a drain/drift region 130, a doped region 120 and a bidirectional clamp 800 with a floating well 410, a first clamp region 411, and a second clamp region 412 as described with reference to FIGS. 2A-2B and 3A.

The silicon carbide device 500 includes a plurality of transistor cells TC with stripe-shaped trench gate structures 150. Longitudinal axes of the gate structures 150 extend along a horizontal direction parallel to a y-axis. Each gate structure 150 includes a conductive gate electrode 155 and a gate dielectric 159 between the gate electrode 155 and the silicon carbide body 100. The gate electrode 155 may include heavily doped polycrystalline silicon. The gate dielectric 159 may consist of or may include silicon oxide, silicon nitride and/or siliconoxynitride.

An active sidewall 151 of each gate structure 150 is parallel or at least approximately parallel to a crystal plane with high charge carrier mobility, e.g. parallel to a <11-20> lattice plane. The active sidewall 151 may be tilted to the vertical z-axis by an off-axis angle of about 4 degrees.

The source region 110 of each transistor cell TC is formed along the first main surface 101 and in contact with the active sidewall 151. The body region 121 forming pn junctions with the source region 110 and the drain/drift region 130 is in contact with the active sidewall 151 and vertically separates the source region 110 and the drain/drift region 130. The drain/drift region 130 may include a lightly doped drift zone 131, more heavily doped current spread regions 137 between the drift zone 131 and the body regions 121 and a heavily doped contact portion 139 formed along the second main surface 102.

A shielding region 126 is in contact with a portion of the gate structure bottom surface 153 at a side opposite to the active sidewall 151 and may extend from the bottom surface 153 into the direction of the second main surface 102. The shielding region 126 forms a pn junction with the drain/drift region 130.

A connection region 125 with the conductivity type of the shielding region 126 extends along the inactive sidewall 152 from the first main surface 101 to or into the shielding region 126 and may form a unipolar junction with the body region 121 of the neighboring transistor cell TC. At least along the first main surface 101 a dopant concentration in the connection regions 125 is sufficiently high such that the connection regions 125 and the metal load contact structures 319 form a low-resistive ohmic semiconductor/metal contact.

A mean net dopant concentration in vertical portions 120v of the doped region 120 along the lateral sides of the floating well 410 and a mean net dopant concentration in the horizontal portion 120h of the doped region 120 between a bottom of the floating well 410 and the drain/drift region 130 are sufficiently high to keep a gain factor of a parasitic npn bipolar transistor structure formed by the floating well 410, the horizontal portion 120h and the drain/drift region 130 sufficiently low to avoid dynamically induced latch-up. Formation of the vertical portion 120v and the horizontal portion 120h may share implantation steps used for forming the shielding region 126 and the connection region 125 and may be defined by modifying existing implant masks for the shielding region 126 and the connection region 125.

A mean net dopant concentration in the main portion 414 of the floating well 410 is selected high enough to prevent from a punch through of the space charge region in both lateral and vertical direction. The mean net dopant concentration in the main portion 414 of the floating well 410 depends on the predetermined breakdown voltage of the bidirectional clamp 800 and on geometric dimensions of the concerned doped portions and may be higher than in the current spread regions 137. Formation of the floating well 410 may require a specific implantation mask defining the lateral extension of the floating well 410 and three or more implantation steps at different acceleration energies for the dopants of the main portion 414 of the floating well 410. Formation of the enhanced portion 415 may require a further implantation mask defining the lateral extension of the enhanced portion 415 and one or more implantation steps at different acceleration energies for doping the enhanced portion 415.

A maximum net dopant concentration in the first and second clamp regions 411, 412 is selected sufficiently high to obtain low-resistive ohmic contacts between the first clamp region 411 and the gate metallization 330 and between the second clamp region 412 and the source metallization 310, and is selected sufficiently low to achieve the desired breakdown voltage for the bidirectional clamp, e.g. a breakdown voltage of at least 100V, 80V, 60V or 50V. The maximum net dopant concentration in the first and second clamp regions 411, 412 may be lower than in the corresponding vertical section of the connection portion 125. Formation of the first and second clamp regions 411, 412 may require an additional implant mask that allows defining the dopant concentration in the first and second clamp regions 411, 412 independently from the dopant concentration in the corresponding vertical section of the connection portion 125.

FIG. 5 shows a plan view of the front side of a silicon carbide body 100, wherein one illustrated stripe-shaped gate structure 150 is representative for a plurality of trench gate structures extending parallel to the y-axis. A first main surface 101 at the front side of the silicon carbide body 100 and a lateral surface 103 of the silicon carbide body 100 may form a front side chip edge with four straight portions oriented orthogonal to each other.

A gate metallization 330 includes a gate pad 335, an integrated gate resistor 333, gate conductors 331, 332, gate contact structures and clamp contact structures.

The gate pad 335 may be formed close to the chip edge, e.g., along a central part of a straight portion of the chip edge. The gate pad 335 may include a thin layer portion and a thick metallization formed on the thin layer portion. The thin layer portion may include elemental titanium, a titanium compound, e.g. titanium nitride (TiN), elemental tantalum (Ta), and/or a tantalum compound, e.g. tantalum nitride (TaN). The thick metallization may include elemental copper (Cu), a copper alloy, elemental aluminum (Al), an aluminum alloy and/or a copper aluminum alloy.

The integrated gate resistor 333 may include doped polycrystalline silicon. A first side of the integrated gate resistor 333 may be electrically connected to the gate pad 335. A second, opposite side of the integrated gate resistor 333 may be directly connected with at least one of the gate conductors 331, 332. The gate conductors 331, 332 include or consist of a thin layer portion. The thin layer portion of the gate conductors 331, 332 and the thin layer portion of the gate pad 335 may have the same structural configuration. For example, both thin layer portions may include the same material and may have the same thickness or may be formed from the same layer stack.

The gate conductors 331, 332 include stripe-shaped first gate runners $331_1$, stripe-shaped second gate runners $331_2$, and stripe-shaped gate fingers 332. The first gate runners $331_1$ have a longitudinal extension parallel to the y-axis. The second gate runners $331_2$ have a longitudinal extension parallel to the x-axis. The first and second gate runners $331_1$, $331_2$ form a frame along the chip edge, wherein the frame may have a gap 337. Longitudinal axes of the gate fingers 332 are parallel to the x-axis and intersect the gate structures 150. Each gate finger 332 is in contact with at least one gate runner 331. Each gate finger 332 electrically connects the gate electrodes 155 of a plurality of gate structures 150 directly or through gate contact structures. Each gate electrode 155 may be directly connected to a plurality of gate fingers 332.

A first load metallization 310 includes a load pad 315, an edge conductor 311, load contact structures and edge contact structures. The load pad 315 may include a thin layer portion and a power metallization formed on the thin layer portion. The thin layer portion may include elemental titanium, a titanium compound, e.g. titanium nitride (TiN), elemental tantalum (Ta), and/or a tantalum compound, e.g. tantalum nitride (TaN). The power metallization may include elemental copper (Cu), a copper alloy, elemental aluminum (Al), an aluminum alloy or a copper aluminum alloy. The power metallization of the load pad 315 and the thick metallization of the gate pad 335 may have the same structural configuration.

The load pad 315 may cover the gate fingers 332. Alternatively, the load pad 315 may include a plurality of interconnected load pad sections, wherein the gate fingers 332 are formed in gaps between neighboring load pad sections.

The edge conductor 311 may form a frame around the load pad 315, wherein the sections of the frame are formed between the gate runners $331_1$, $331_2$ and the chip edge. The edge conductor 311 includes a thin layer portion and may include a power metallization formed on the thin layer portion. The thin layer portion of the edge conductor 311 and the thin layer portion of the load pad 315 may have the same structural configuration and may form a contiguous structure extending through the gap 337 in the gate runner frame.

The silicon carbide device 500 may include at least one of a first clamp part 801 formed along a first gate runner $331_1$, a second clamp part 802 formed along an edge of the gate pad 335, and a third clamp part 803 formed along a second gate runner $331_2$.

The first clamp part 801 may extend along one or both first gate runners $331_1$. Along each first gate runner $331_1$ one single portion of the first clamp part 801 may be formed. The single portion may extend across at least half of the length of the first gate runner $331_1$ or across at least 90%. More than one portion may be formed along each first gate runner $331_1$.

The second clamp part 802 may extend along one, two, three or all edges of the gate pad 335. The second clamp part 802 may be one contiguous structure or may include two or more laterally separated portions.

The third clamp part 803 may extend along one or both second gate runners $331_2$. Along each second gate runner $331_2$ one single portion of the third clamp part 803 may be formed. The single portion may extend across at least half of the length of the second gate runner $331_2$ or across at least 90%. More than one portion may be formed along each second gate runner $331_2$.

A silicon carbide device 500 may exclusively include a first clamp part 801, a second clamp part 802, or a third clamp part 803, may include any combination of two of said clamp parts 801, 802, 803 or may include all three clamp parts 801, 802, 803.

Figure 6A:
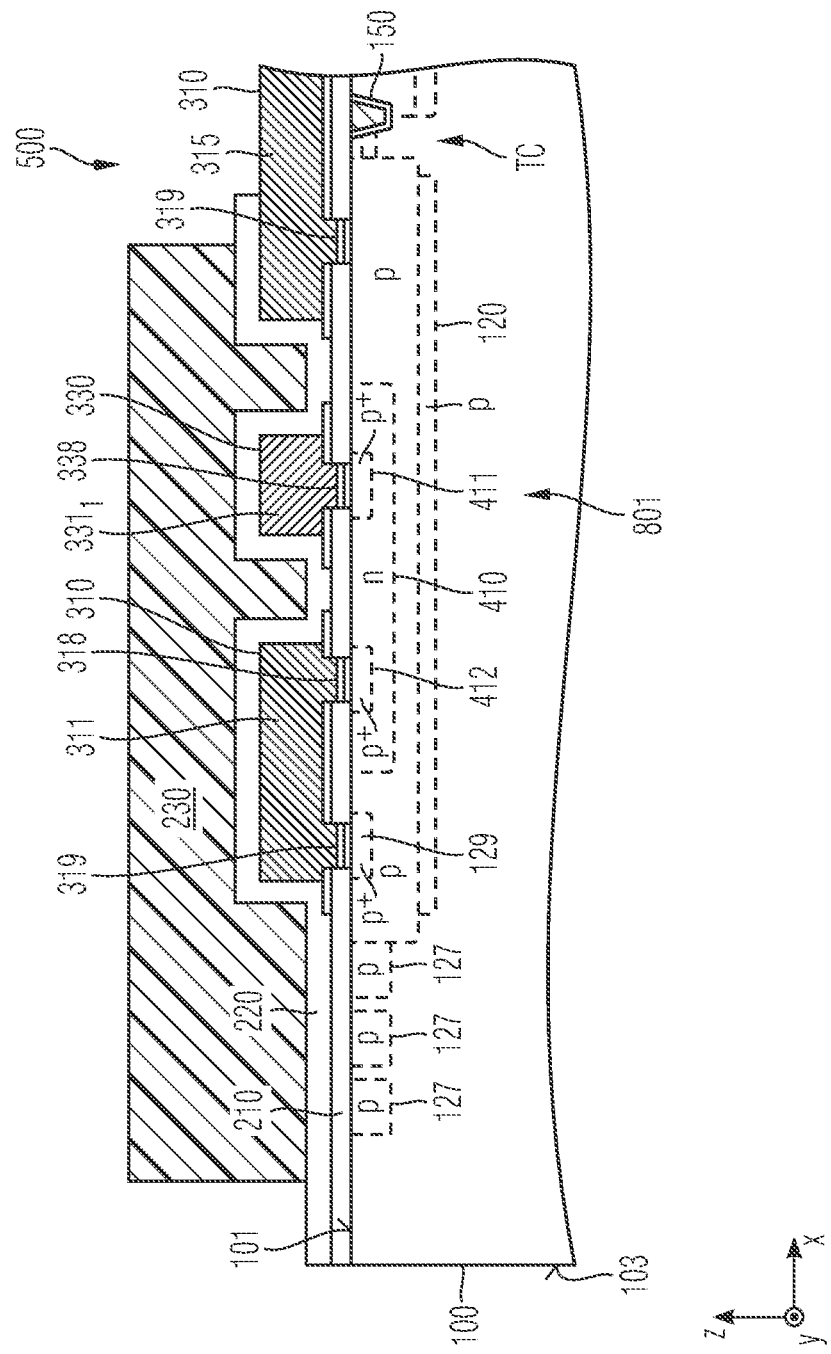
FIGS. 6A-6B show schematic vertical cross-sectional views of portions of silicon carbide devices according to embodiments with an integrated bidirectional clamp formed below a gate runner and an edge conductor.

FIG. 6A shows a first clamp part 801 with a first clamp region 411 and a second clamp region 412 extending into a floating well 410 as illustrated in FIGS. 3A and 4. The first clamp region 411 is formed directly below a first gate runner $331_1$ with a longitudinal axis parallel to the y-axis. The second clamp region 412 is formed directly below a portion of an edge conductor 311 between the first gate runner $331_1$ and the lateral surface 103 of the silicon carbide body 100. A first load contact structure 319 forms a low-resistive ohmic contact between a load pad 315 and the doped region 120 at a side of the first gate runner $331_1$ opposite to the edge conductor 311. A second load contact structure 319 forms a low-resistive ohmic contact between the edge conductor 311 and the doped region 120 through a heavily doped contact region 129. The heavily doped contact region 129 is laterally separated from the floating well 410 by a less strongly doped portion of the doped region 120.

The doped region 120 includes laterally separated guard rings 127 extending between the floating well 410 and the lateral surface 103 from the first main surface 101 into the silicon carbide body 100. A dielectric passivation layer 220 extending inwardly from the lateral surface 103 to beyond an outer edge of the load pad 315 covers the edge conductor 311 and the first gate runner $331_1$. An imide layer 230 may cover a portion of the passivation layer 220.

Figure 6B:
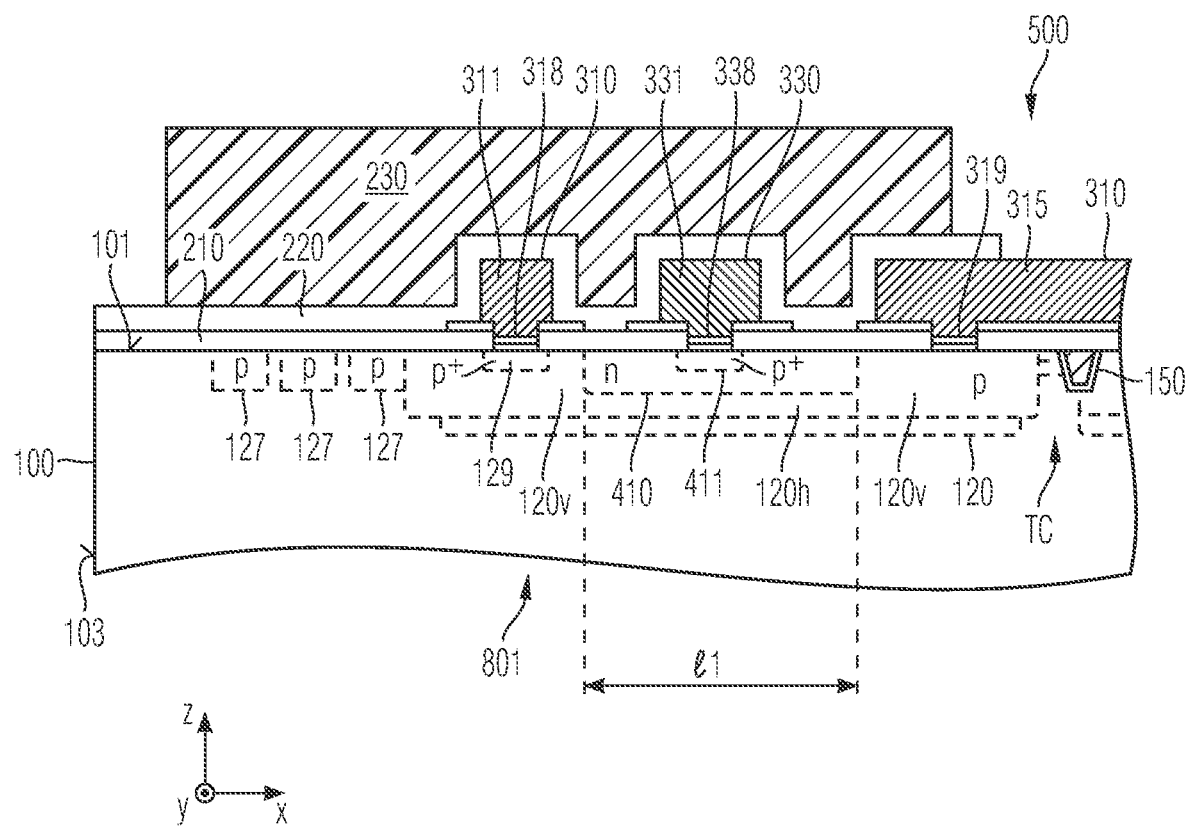

In FIG. 6B the floating well 410 is formed below the first gate runner $331_1$ and is absent below the edge conductor 311. An edge contact structure 318 forms an ohmic contact between the edge conductor 311 and the doped region 120. Ohmic contacts to the doped region 120 may be formed on opposite sides of the first clamp region 411 as illustrated in FIG. 6B. Alternatively, the ohmic contact between the load pad 315 and the doped region 120 may be absent and the transistor cells TC may be formed closer to the floating well 410 (not illustrated).

A length of the floating well 410 along the x-axis may be as short as possible to reduce the ohmic resistance between the portions of the doped region 120 on opposite sides of the floating well 410. A sufficiently low resistance of the horizontal portion 120h of the doped region 120 between the floating well 410 and the drain/drift region 130 may prevent from latch-up during dynamic switching of the transistor cells TC.

Figure 7:
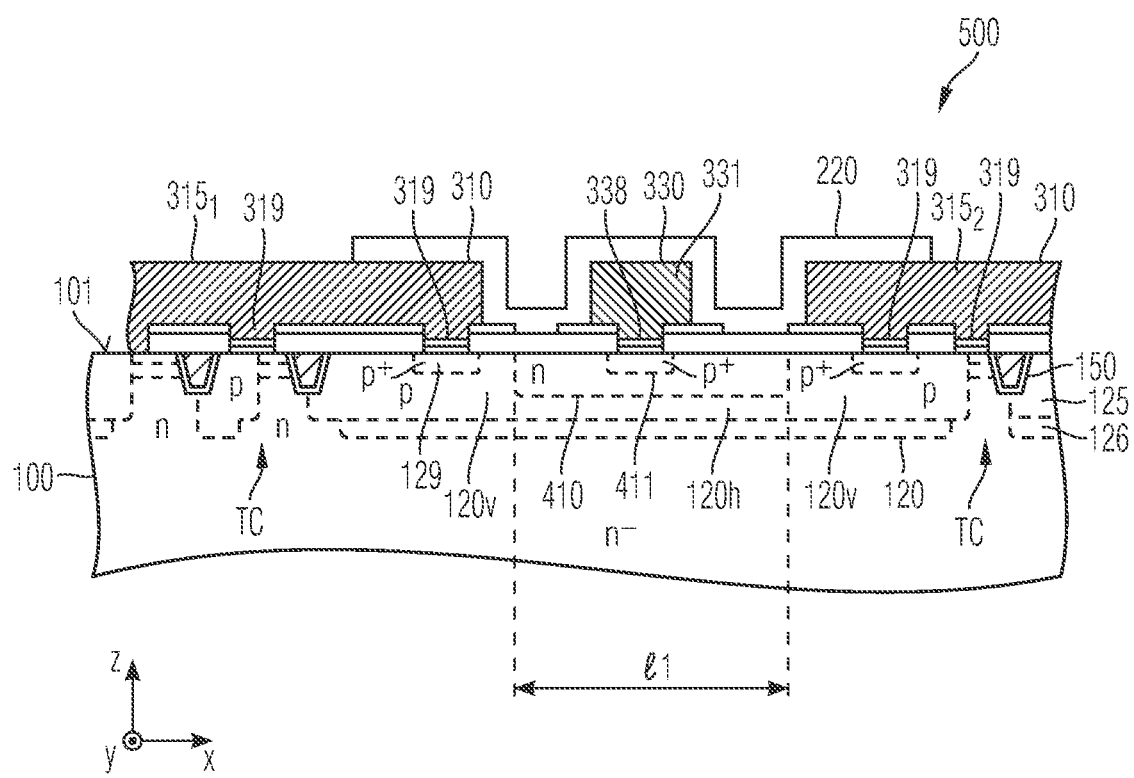
FIG. 7 shows a schematic vertical cross-sectional view of a portion of a silicon carbide device according to an embodiment with an integrated bidirectional clamp formed between a gate runner and two pad sections of a split load pad.

FIG. 7 shows a clamp part 800 with a first clamp region 411 directly below a gate conductor 331 running parallel to the gate electrodes 150 between neighboring pad sections $315_1$, $315_2$ of a split load pad 315.

Figure 8A:
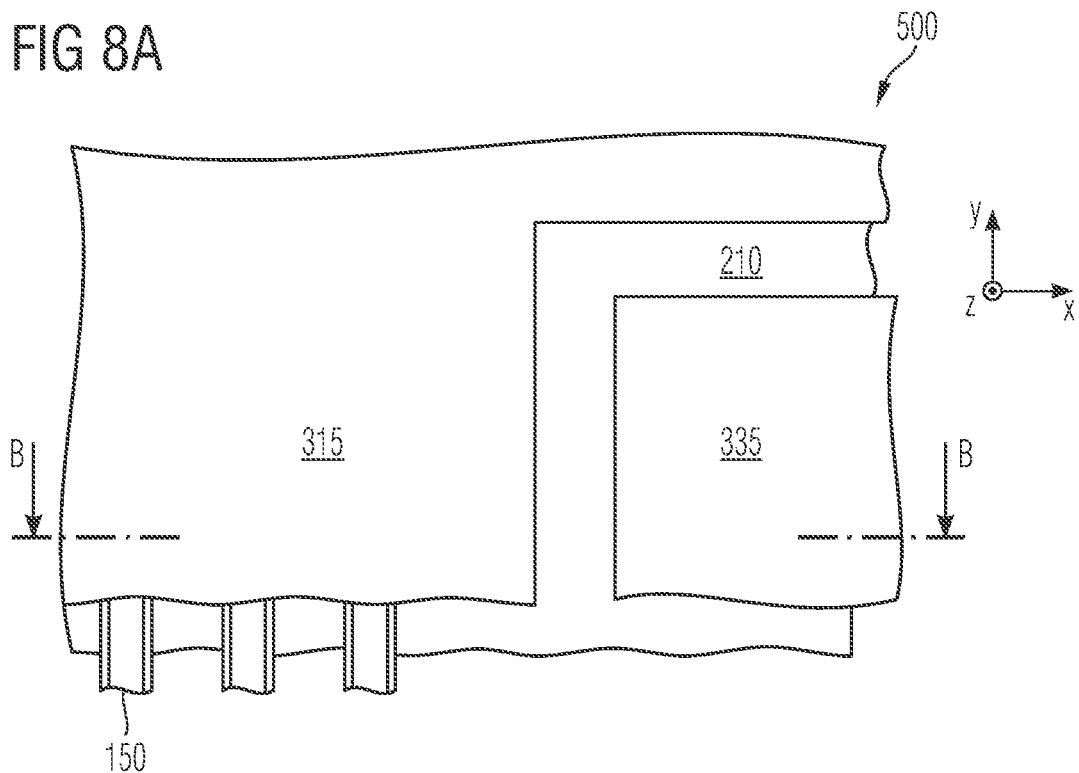
FIGS. 8A-8B show a simplified plan view and a corresponding simplified vertical cross-sectional view of a portion of a silicon carbide device with bidirectional clamp according to an embodiment with a first clamp region connected to a gate pad and with a second clamp region connected to a load pad.
Figure 8B:
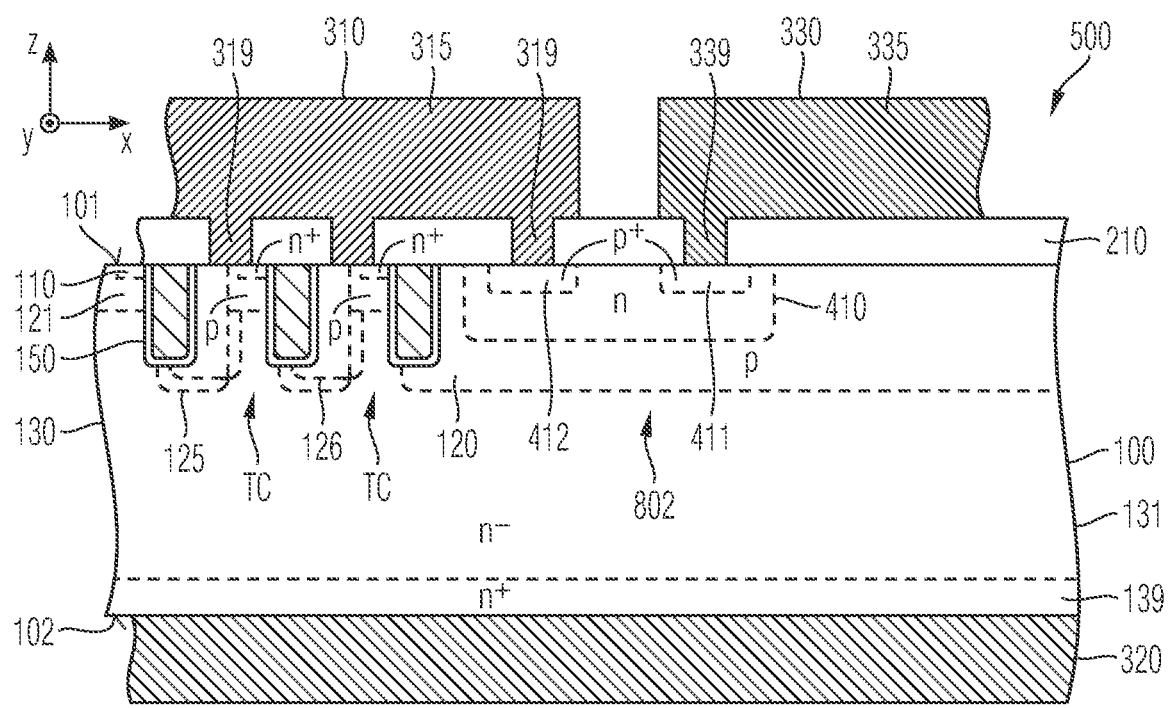

FIGS. 8A and 8B show a second clamp part 802 with the first clamp region 411 formed directly below an outer portion of a gate pad 335 and with the second clamp region 412 formed directly below a portion of a load pad 315 oriented to the gate pad 335. The floating well 410 spans a gap between the load pad 315 and the gate pad 335. The doped region 120 may extend from the gate structure 150 closest to the gate pad 335 to below the gate pad 335.

Figure 9A:
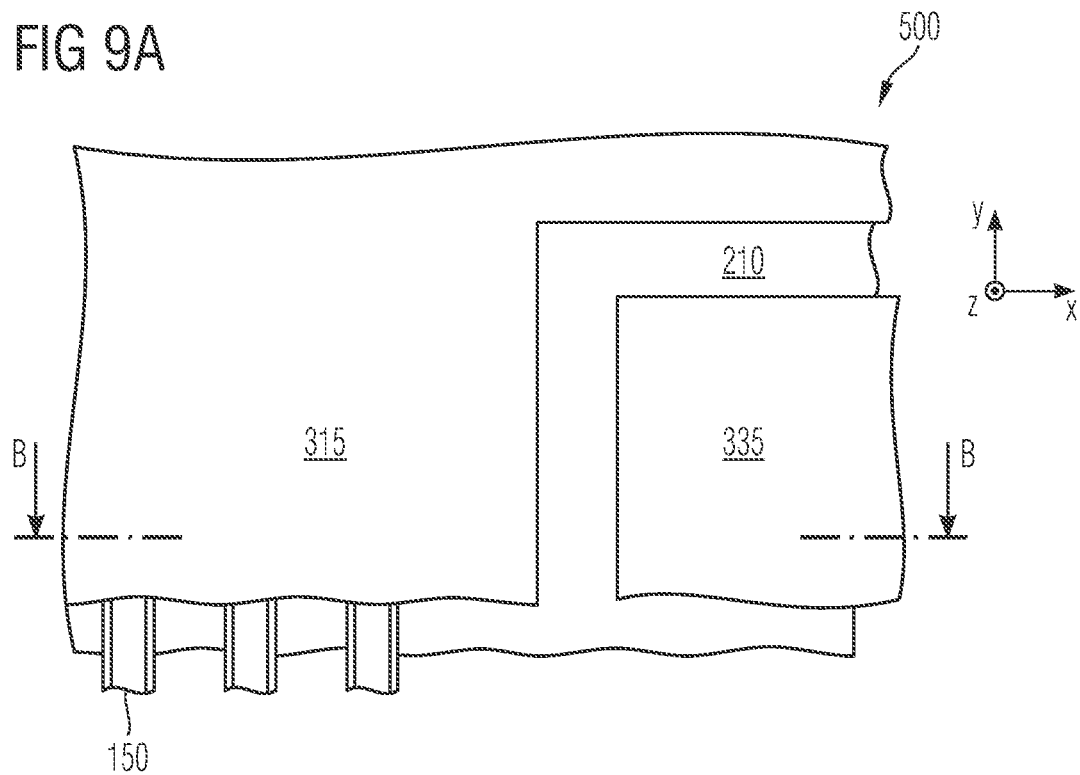
FIGS. 9A-9B show a simplified plan view and a corresponding simplified vertical cross-sectional view of a portion of a silicon carbide device with an integrated bidirectional clamp according to another embodiment with a first clamp region connected to a gate pad.
Figure 9B:
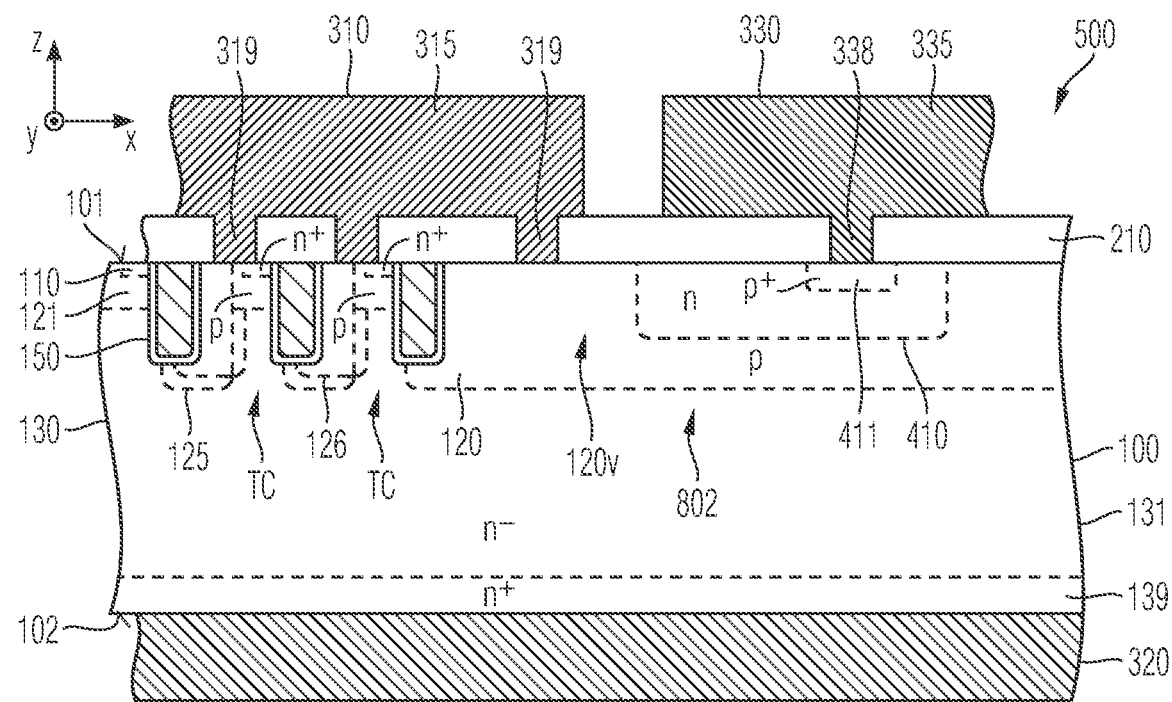

In FIGS. 9A and 9B the floating well 410 does not extend to below the load pad 315. A load contact structure 319 closest to the gate pad 335 forms a low-resistive ohmic contact with a vertical portion 120v of the doped region 120.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A silicon carbide device, comprising:
   a transistor cell comprising a source region of a first conductivity type and a gate electrode, wherein the source region is formed in a silicon carbide body;
   a doped region of a second conductivity type, wherein a first low-resistive ohmic path electrically connects the doped region and the source region;
   a floating well of the first conductivity type, wherein the floating well and the doped region form a pn junction; and
   a first clamp region of the second conductivity type, wherein the first clamp region extends into the floating well, and wherein a second low-resistive ohmic path electrically connects the first clamp region and the gate electrode.

2. The silicon carbide device of claim 1, further comprising:
   a gate metallization,
   wherein the gate metallization and the gate electrode are electrically connected, and
   wherein the gate metallization and the first clamp region form a low-resistive ohmic contact.

3. The silicon carbide device of claim 1, further comprising:
   a first load metallization, wherein the first load metallization and the source region form a low-resistive ohmic contact, and
wherein the first load metallization and the doped region form a low-resistive ohmic contact.

4. The silicon carbide device of claim 3,
wherein the doped region includes a second clamp region within the floating well,
wherein the second clamp region has the second conductivity type, and
wherein the first load metallization and the second clamp region form a low-resistive ohmic contact.

5. The silicon carbide device of claim 4,
wherein the floating well, the first clamp region, and the second clamp region extend from a first main surface of the silicon carbide portion into the silicon carbide body.

6. The silicon carbide device of claim 4,
wherein the floating well comprises a main portion and an enhanced portion,
wherein a mean net dopant concentration in the enhanced portion is higher than in the main portion and lower than in the source region, and
wherein a first part of the enhanced portion is between the first clamp region and the second clamp region.

7. The silicon carbide device of claim 6,
wherein the first part of the enhanced portion extends from the first clamp region to the second clamp region.

8. The silicon carbide device of claim 6,
wherein the enhanced portion laterally surrounds the first and second clamp regions.

9. The silicon carbide device of claim 6,
wherein the enhanced portion is laterally separated from a lateral sidewall of the floating well.

10. The silicon carbide device of claim 1,
wherein a bidirectional clamp including the first clamp region, the floating well and a portion of the doped region is configured to carry a breakdown current of at least 0.5 A.

11. The silicon carbide device of claim 1,
wherein the second low-resistive ohmic path includes a gate conductor crossing the gate electrode,
wherein a low-resistive ohmic contact is formed between the gate conductor and the gate electrode, and
wherein another low-resistive ohmic contact is formed between the gate conductor and the first clamp region.

12. The silicon carbide device of claim 11,
wherein the first low-resistive ohmic path includes an edge conductor between the gate conductor and a lateral surface of the silicon carbide body, and
wherein a low-resistive ohmic contact is formed between the edge conductor and a portion of the doped region.

13. The silicon carbide device of claim 12,
wherein the doped region includes a second clamp region within the floating well, and
wherein the low-resistive ohmic contact is formed between the edge conductor and the second clamp region.

14. The silicon carbide device of claim 1,
wherein the first low-resistive ohmic path further includes a load pad, and
wherein a low-resistive ohmic contact is formed between the load pad and the doped region.

* * * * *